(12) United States Patent
Duqi et al.

(10) Patent No.: US 11,673,799 B2
(45) Date of Patent: Jun. 13, 2023

(54) METHOD OF PROCESSING A WAFER FOR MANUFACTURING AN OSCILLATING STRUCTURE SUCH AS A MICRO-MIRROR

(71) Applicant: STMicroelectronics S.r.l., Agrate Brianza (IT)

(72) Inventors: Enri Duqi, Milan (IT); Nicolo' Boni, Albino (IT); Lorenzo Baldo, Bareggio (IT); Massimiliano Merli, Pavia (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 314 days.

(21) Appl. No.: 17/155,429

(22) Filed: Jan. 22, 2021

(65) Prior Publication Data

US 2021/0229984 A1    Jul. 29, 2021

(30) Foreign Application Priority Data

Jan. 24, 2020   (IT) .................. 102020000001411

(51) Int. Cl.
*B81C 1/00* (2006.01)
*H01L 41/35* (2013.01)

(52) U.S. Cl.
CPC .......... *B81C 1/00158* (2013.01); *H01L 41/35* (2013.01); *B81C 2201/013* (2013.01)

(58) Field of Classification Search
None
See application file for complete search history.

(56) References Cited

U.S. PATENT DOCUMENTS

| | | | |
|---|---|---|---|
| 2015/0077824 A1* | 3/2015 | Yasuda | G02B 26/0833 359/224.1 |
| 2016/0116732 A1* | 4/2016 | Yasuda | G02B 26/101 359/200.7 |
| 2016/0274354 A1* | 9/2016 | Fujimoto | G02B 26/0833 |
| 2018/0031823 A1* | 2/2018 | Carminati | H01L 41/053 |
| 2018/0113200 A1* | 4/2018 | Steinberg | G01S 7/4815 |
| 2019/0039880 A1* | 2/2019 | Paci | H04N 23/67 |

FOREIGN PATENT DOCUMENTS

| | | |
|---|---|---|
| CN | 1467521 A | 1/2004 |
| CN | 1614458 A | 5/2005 |
| CN | 107664836 A | 2/2018 |
| CN | 108594428 A | 9/2018 |

OTHER PUBLICATIONS

EPO Search Report and Written Opinion for co-pending EP Appl. No. 21152454.1 dated Jun. 22, 2021 (6 pages).
IT Search Report and Written Opinion for IT Appl. No. 102020000001411 dated Oct. 7, 2020 (7 pages).
First Office Action and Search Report for counterpart CN Appl. No. 202110095545.5, report dated Aug. 9, 2022, 7 pgs.

* cited by examiner

*Primary Examiner* — Benjamin P Sandvik
(74) *Attorney, Agent, or Firm* — Crowe & Dunlevy

(57) ABSTRACT

To manufacture an oscillating structure, a wafer is processed by: forming torsional elastic elements; forming a mobile element connected to the torsional elastic elements; processing the first side of the wafer to form a mechanical reinforcement structure; and processing the second side of said wafer by steps of chemical etching, deposition of metal material, and/or deposition of piezoelectric material. Processing of the first side of the wafer is carried out prior to processing of the second side of the wafer so as not to damage possible sensitive structures formed on the first side of the wafer.

25 Claims, 3 Drawing Sheets

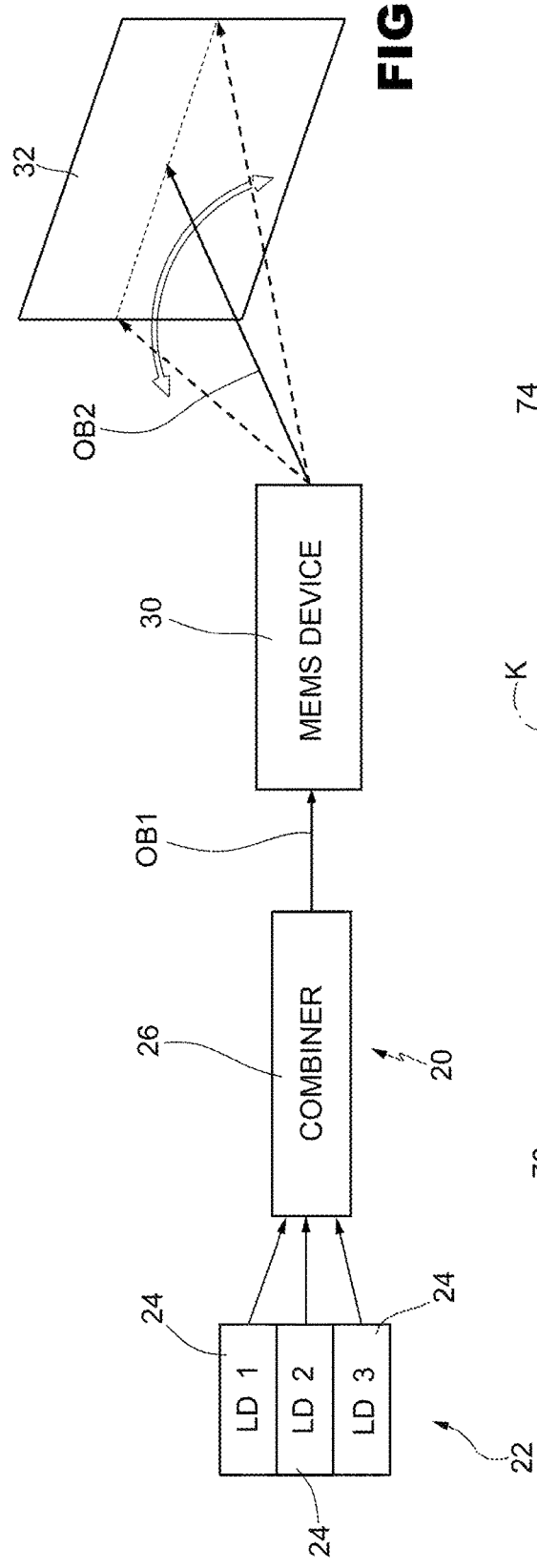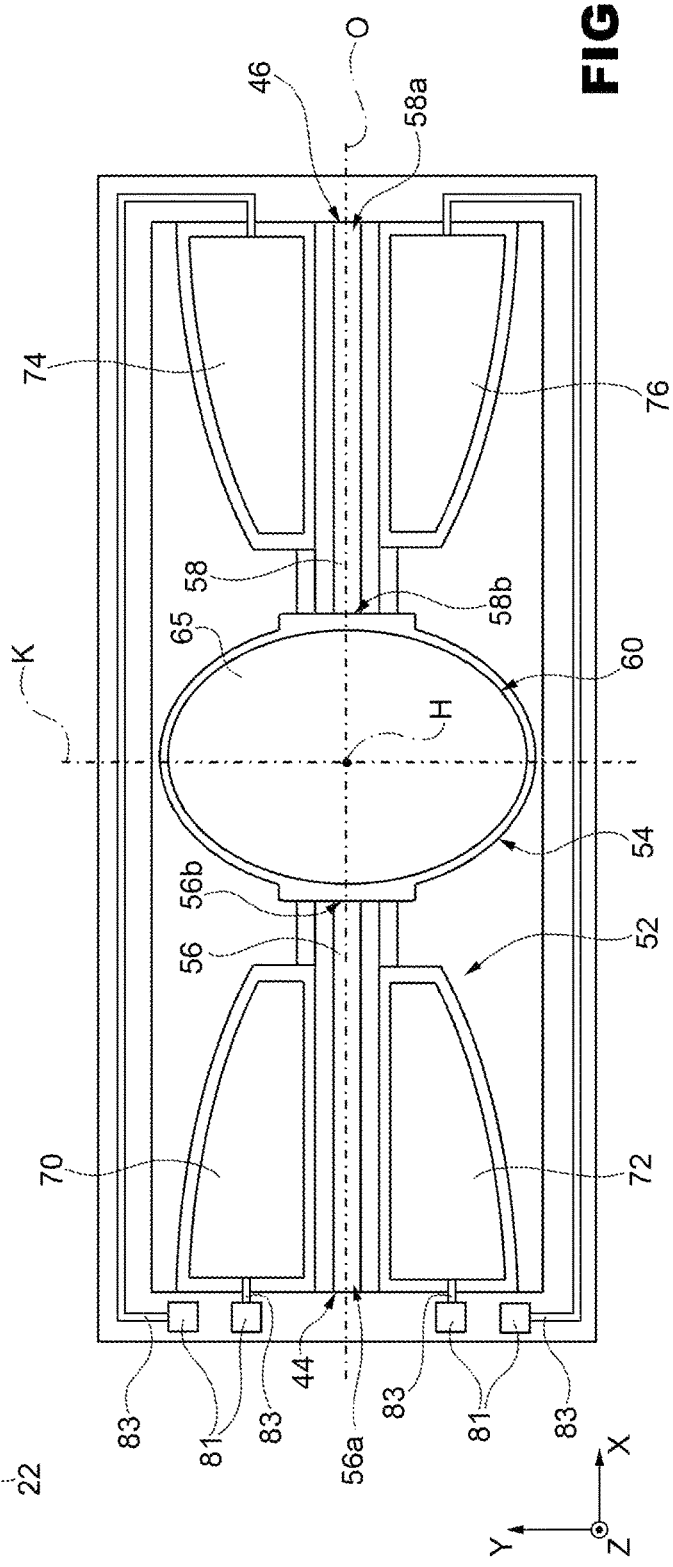

METHOD OF PROCESSING A WAFER FOR MANUFACTURING AN OSCILLATING STRUCTURE SUCH AS A MICRO-MIRROR

PRIORITY CLAIM

This application claims the priority benefit of Italian Application for Patent No. 102020000001411, filed on Jan. 24, 2020, the content of which is hereby incorporated by reference in its entirety to the maximum extent allowable by law.

TECHNICAL FIELD

This disclosure relates to a method of processing a wafer for manufacturing an oscillating structure, in particular with piezoelectric actuation.

BACKGROUND

Micromechanical mirror (or reflector) structures are known to be made, at least partly, of semiconductor materials and obtained using MEMS (Micro-Electro-Mechanical Systems) technology.

MEMS reflectors are configured to receive an optical beam and to vary the direction of propagation thereof, in a periodic or quasi-periodic way. For this purpose, MEMS reflectors include mobile elements formed by mirrors, the positions of which in space are controlled electrically by appropriate oscillation-control signals.

For instance, United States Patent Application Number 2011/0109951 (incorporated by reference) describes a circuit for controlling the position of a mirror of a MEMS reflector of a resonant type, the mirror being arranged so as to rotate, under the action of an actuator of an electrostatic type, about an axis of rotation. In particular, the MEMS reflector according to this patent application comprises a fixed supporting body made of semiconductor material and a mirror which is affixed to the fixed supporting body by torsional springs.

Applications using actuators of a piezoelectric type are likewise known.

One or more of the steps for manufacturing the mirror, the torsional springs, and the actuators prove difficult, complex, and in general involve particular attention in so far as it is expedient to aim to guarantee a reduced residual stress of the structures thus manufactured, in order to prevent undesired warping or deformations of the mirror when in its resting state.

In addition, known approaches envisage steps of machining of both the front and rear faces (opposite to one another) of the wafer/wafers on which the mirror is manufactured, for example to form the reflector and/or the piezoresistive actuators (or other sensitive structures) on the front face, and mechanical reinforcement and/or anchorage structures on the rear face. Specific precautions are taken (in particular, the use of supporting and handling wafers and/or the use of compatible chemistries) to prevent damage to sensitive structures (e.g., reflectors/actuators) of the front during machining of the back.

There is a need in the art for a method of processing a wafer for manufacturing an oscillating structure that will, in particular, overcome undesirable aspects of the prior art.

SUMMARY

Disclosed herein is a method of processing a wafer having a first side and a second side opposite to one another, for manufacturing an oscillating structure, the method including steps of: a) forming first and second elastic torsional elements which are constrained to respective portions of a fixed supporting body and define an axis of rotation; b) forming a mobile element interposed between, and connected to, the first and second elastic torsional elements, the mobile element being rotatable about the axis of rotation as a consequence of a torsion of the first and second deformable elements; and c) processing the first side of the wafer at the mobile element to form a mechanical reinforcement structure for the mobile element, by: c1) growing, on the first side of the wafer, a reinforcement layer; and c2) patterning the reinforcement layer by removing selective portions of the reinforcement layer. The method also includes the step of: d) processing the second side of the wafer, including carrying out, at the second side of the wafer, at least one of: chemical etching, deposition of metal material, and deposition of piezoelectric material. Step d) is performed after performing step c).

The method may also include the step of coupling a supporting structure to the first side of the wafer, after performing step c) but before performing step d).

The supporting structure may be provided with a recess, and the step of coupling the supporting structure to the first side of the wafer may be carried out so that the mechanical reinforcement structure is completely contained within the recess.

Step d) may include processing the second side of the wafer, including carrying out, at the second side of the wafer, at least deposition of metal material. The deposition of metal material may be carried out to form a reflecting layer on the mobile element and/or an electrical contact and/or an electrical path. The deposition of piezoelectric material may be carried out to form a piezoelectric actuator configured to cause, in use, the torsion of the first and the second elastic torsional elements.

The wafer may be a silicon on insulator (SOI) wafer including an insulating layer interposed between a substrate and a structural layer. The method may also include the step of forming an etch-stop layer on the structural layer, the reinforcement layer being grown on the etch-stop layer and the step of forming the mechanical reinforcement structure including carrying out steps of masked etching of the reinforcement layer for removing selective portions thereof until the etch-stop layer is reached.

The method may also include the step of removing selective portions of the reinforcement layer to form at least one fluidic access channel adapted to set in fluidic communication the recess with an environment external to the recess.

The wafer may be a SOI wafer including an insulating layer interposed between a substrate and a structural layer. The step of processing the second side of the wafer may include: carrying out a step of thinning the substrate until the insulating layer is reached; removing selective portions of the insulating layer to expose respective surface regions of the structural layer; and carrying out at least one operation from among the chemical etching, the deposition of metal material, and the deposition of piezoelectric material.

The chemical etching may be carried out to form a central body of the oscillating structure, the first elastic torsional element, the second elastic torsional element, and the mobile element.

The chemical etching may be carried out to form one or more structures configured to carry out electrostatic actuation of the oscillating structure.

BRIEF DESCRIPTION OF THE DRAWINGS

For a better understanding, certain embodiments are now described, purely by way of non-limiting example, with reference to the attached drawings, wherein:

FIG. 1 shows a block diagram of an electronic circuit for driving an oscillating structure, in particular a MEMS reflector, described herein;

FIG. 2 shows, in top view, an oscillating structure described herein; and

DETAILED DESCRIPTION

Figure 3:
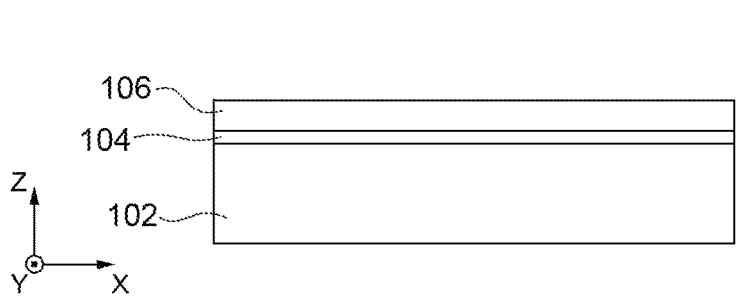
FIGS. 3-10 show, in a lateral sectional view, the results of performing a series of steps for manufacturing the oscillating structure of FIG. 2.

FIG. 1 shows a projective MEMS system 20 which includes a light source 22 formed, for example, by a plurality of laser diodes (LDs) 24, each of which emits electromagnetic radiation at a corresponding wavelength. For instance, illustrated in FIG. 1 are three LDs 24 (LD1, LD2, LD3), each of which emits radiation respectively in the vicinity of red (620-750 nm), green (495-570 nm), and blue (450-475 nm).

The projective MEMS system 20 further comprises a combiner 26, a MEMS device 30, and a screen 32. The combiner 26 is arranged downstream of the light source 22 so as to receive the electromagnetic radiation emitted by the LDs 24 and form a single optical beam OB1, obtained by combination of the electromagnetic radiation. The combiner 26 is moreover adapted to direct the optical beam OB1 onto the MEMS device 30. In turn, the MEMS device 30, described in greater detail hereinafter, is adapted to generate a reflected optical beam OB2 and to direct the reflected optical beam OB2 onto the screen 32, so as to enable formation of images on the screen 32.

In detail, the MEMS device 30 is adapted to vary in time the orientation in space of the axis of the reflected optical beam OB2 so as to periodically scan portions of the screen 32. In particular, the reflected optical beam OB2 linearly scans a portion of the screen 32 (possibly the entire screen).

It is evident that the MEMS device 30 can find application in a system different from the one illustrated in FIG. 1.

FIG. 2 shows, in top view in a plane XY, an embodiment of the MEMS device 30.

The MEMS device 30 comprises a fixed supporting body 40, in particular of semiconductor material, which includes a first and a second structural region 44, 46.

The MEMS device 30 is illustrated in an orthogonal reference system formed by three axes X, Y, Z. Likewise, an axis H is defined parallel to the Z axis of the reference system. The fixed supporting body 40 defines a cavity 52. The MEMS device 30 further comprises a mobile body 54, which is affixed to first and second structural regions 44, 46 of the fixed supporting body 40 and is likewise suspended over the cavity 52.

The mobile body 54 has a central portion 60, for example circular in plan view (in the horizontal plane XY), set on which is a reflecting element (which is, in what follows, referred to as "mirror layer") 65, including a material with high reflectivity in regard to the light radiation to be projected, such as a metal, for example aluminum or gold.

The mobile body 54 further includes first and second deformable elements 56, 58 (also referred to as "arms"), in particular configured to undergo deformation of a torsional type.

The central portion 60 is mechanically coupled to the first and second deformable elements 56, 58 and, via the latter, to the first and second structural regions 44, 46.

A first end 56a of the first deformable element 56 is fixed with respect to the first structural region 44, while a first end 58a of the second deformable element 58 is fixed with respect to the second structural region 46. Moreover, a second end 56b of the first deformable element 56 and a second end 58b of the second deformable element 58 are fixed with respect to the central portion 60, in respective regions of the latter opposite to one another along the axis X.

According to an embodiment provided by way of non-limiting example of the present disclosure, in resting conditions, each of the first and second deformable elements 56, 58 has a parallelepiped shape, the dimension of which in a direction parallel to the X axis is greater than the corresponding dimensions along the Y and Z axes; for example, the dimension parallel to the X axis is at least five times greater than the dimensions along the Y and Z axes. In resting conditions, each of the first and the second deformable elements 56, 58 has two faces parallel to the XY plane and opposite to one another along the Z axis. Likewise, the mobile body 54 (in particular, the central portion 60) has two faces parallel to the XY plane and opposite to one another along the Z axis.

For practical purposes, the first and second deformable elements 56, 58 function, respectively, as first and second springs since each of them can undergo a torsion about the axis O, and subsequently return into the position assumed in resting conditions. During torsion of the first and second deformable elements 56, 58, the two faces thereof that, in a resting condition, are arranged in planes parallel to the XY plane, are displaced, with respect to the resting position, rotating about the axis O and bringing the central portion 60 and the mirror layer 65 into rotation about the axis O.

According to one aspect of the present disclosure, a first 70, a second 72, a third 74, and a fourth actuator 76, of a piezoelectric type, are arranged laterally with respect to the first and second deformable elements 56, 58. In particular, the first and the second actuators 70, 72 extend, in top view in the XY plane, on opposite sides, along the Y axis, of the first deformable element 56; the third and fourth actuators 74, 76 extend, in top view in the XY plane, on opposite sides, along the Y axis, of the second deformable element 58.

Respective ends of the first and second actuators 70, 72 are fixed with respect to the first structural region 44, while the other respective ends of the first and second actuators 70, 72 are fixed with respect to the central portion 60. Likewise, respective ends of the third and fourth actuators 74, 76 are fixed with respect to the second structural region 46, while the other respective ends of the third and fourth actuators 74, 76 are fixed with respect to the central portion 60.

In one embodiment, the first and second actuators 70, 72 are mutually symmetrical with respect to the axis O and with respect to the first deformable element 56, and the third and fourth actuators 74, 76 are mutually symmetrical with respect to the axis O and with respect to the second deformable element 58. In different embodiments, the actuators may not be symmetrical, according to specific design choices.

Each actuator 70-76 includes a respective layer of piezoelectric material interposed between control electrodes, which can be biased for generating a controlled deformation of the piezoelectric material. In a way not illustrated in FIG. 2, the actuators 70-76 are covered by a protective and electrically insulating layer, for example a dielectric material such as silicon oxide. Since, in use, the actuators 70-76 have the function of triggering and/or maintaining the oscillation of the mobile body 54, they extend, in one embodiment, symmetrically with respect to an axis K (parallel to the Y axis) passing through the centroid of the mobile body 54 (i.e., through the point of intersection between the axes O and H) and orthogonal to both of the axes O and H. In this way, no uncontrolled oscillations caused by a possible asymmetry of the actuators are generated. It is evident that, in different embodiments and to satisfy specific design requirements, the actuators may be asymmetrical.

In use, when appropriate control voltages are applied to the actuators 70-76 via electrical contact pads 81 and conductive paths 83, a local deformation is generated, which is transferred directly to the mobile body 54, imparting a rotation of the mobile body 54 about the axis O, thanks to the torsion of just the first and second deformable elements 56, 58.

According to a different embodiment, not illustrated, the actuators 70-76 each have a respective end coupled to either the first structural region 44 or the second structural region 46 and a second respective end coupled to a respective deformable element 56, 58 along which they extend (i.e., they are not directly coupled to the central portion 60). The operation remains similar to what has been described above.

The present disclosure likewise applies to MEMS devices provided with an oscillating structure with actuators other than piezoelectric actuators, for example, a structure with electrostatic actuation (not illustrated in the figures) and therefore provided with actuators configured to be biased so as to cause and/or sustain an oscillation of the oscillating structure. The electrostatic actuators are, for example, obtained via etching steps.

According to one aspect described herein, it is possible to form, optionally, a reinforcement structure (which cannot be appreciated from the view of FIG. 2) on the rear face of the mobile body 54, in particular on the rear face of the central portion 60. This reinforcement structure has, for example, an annular shape. The reinforcement structure has the function of mechanical reinforcement for the central portion 60, reducing deformation thereof during oscillation.

It is evident that the mechanical reinforcement structure may have a shape different from the annular shape; for example, it may comprise one or more ribbings, or beam structures, or rib structures, or it may have any other shape adapted to provide a mechanical reinforcement for the central portion 60.

In an embodiment of the present disclosure, the central portion 60, the first and second connection regions 55, 57, the first and second deformable elements 56, 58, and the first and second structural regions 44, 46 form a single piece; i.e., they belong to a monolithic structure, in particular including semiconductor material obtained by micromachining techniques used in the semiconductor and MEMS industry.

FIGS. 3-10 are schematic representations of steps for manufacturing a MEMS device provided with an oscillating structure, for example the MEMS device 30 of FIG. 2. The views of FIGS. 3-10 are lateral sectional views, taken along a line of section coinciding with the axis K of FIG. 2.

With reference to FIG. 3, a wafer 100, for example of a SOI (Silicon Over Insulator) type is provided, including a substrate 102 of semiconductor material, such as silicon, an insulating layer 104, for example, of silicon oxide, which extends on the substrate 102, and a structural layer 106, which extends on the insulating layer 104.

Figure 4:
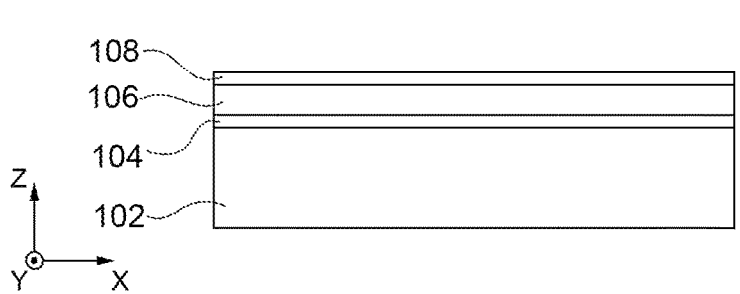

Then, with reference to FIG. 4, a further insulating layer 108, for example, of silicon oxide formed by thermal oxidation, is disposed on the structural layer 106. The insulating layer 108 has, for example, a thickness of 1 µm.

Figure 5:
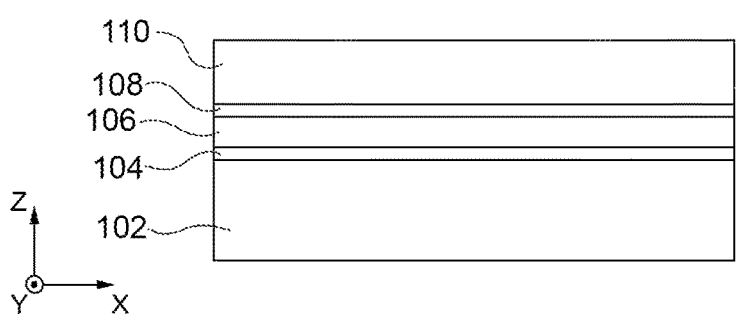

This is followed, as shown in FIG. 5, by a step of epitaxial growth of a structural layer 110, and subsequent planarization (e.g., by the CMP technique), to achieve a final thickness, measured along the Z axis, comprised between 50 and 150 µm.

Figure 6:
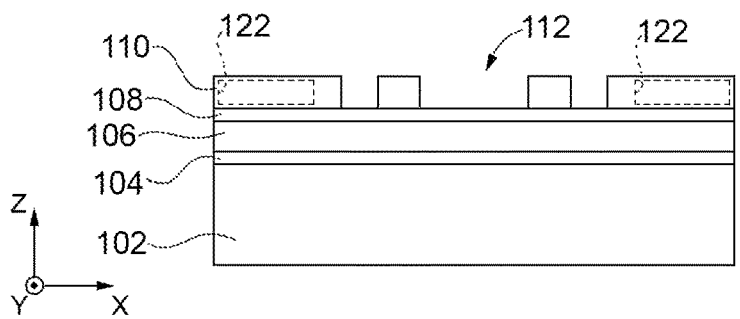

There then follows, as shown in FIG. 6, formation of the reinforcement structure (here by way of example defined as "annular", without this implying any loss of generality), designated by the reference 112, which, at the end of the manufacturing steps, extends underneath the central portion 60. The annular structure 112 is formed by removing selective portions of the structural layer 110 (by known lithographic and etching steps). The insulating layer 108 here has the function of an etch-stop layer.

As an alternative to what has been described for the step of FIG. 4, it is possible to use materials other than an insulator to form the insulating layer 108, provided that the structural layer 110 can be etched selectively in regard to the material of which the insulating layer 108 is made.

As mentioned previously, the annular structure 112 has the function of providing mechanical reinforcement for the central portion 60, reducing deformation thereof during oscillation, and may be omitted.

During the etching process represented in FIG. 4, optionally, one or more fluidic paths 122 are likewise formed in the structural layer 110 configured to set in fluidic communication (here, in particular, the fluid considered is air) the environment external to the MEMS device 30 with an internal cavity that will be formed and described with reference to FIG. 7. In FIG. 6 the fluidic paths 122 are represented with a dashed line in so far as they could extend along a section different from the one considered.

As an alternative or in addition to the step of formation of the annual structure 112 (reinforcement structure), it is possible to carry out other machining processes on the back of the central portion 60, for example to obtain edge anchorage regions.

Figure 7:
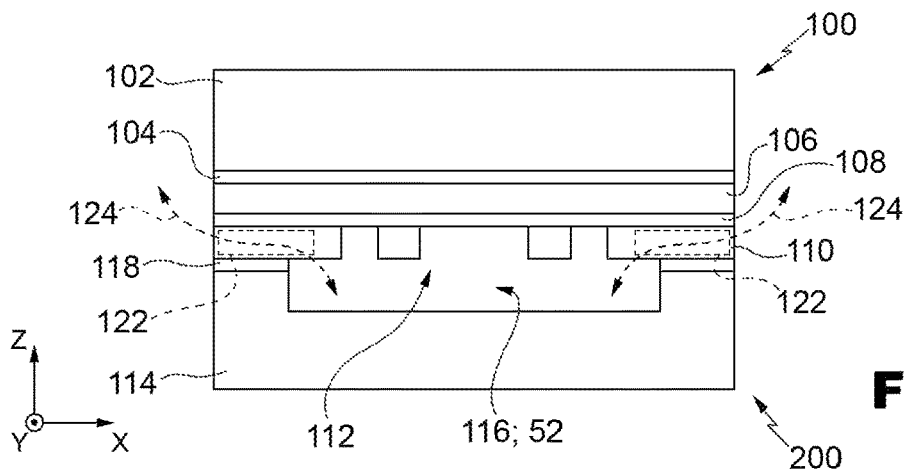

There then follows, as shown in FIG. 7, a step of coupling of a cap 114 to the structural layer 110, laterally with respect to the region thereof that houses the annular structure 112. In other words, the cap completely surrounds the annular structure 112.

In particular, the cap 114 is obtained in a wafer 200 different from the wafer 100 and comprises a recess 116 within which the annular structure 112 is housed.

The cap 114 is, for example, of semiconductor material (for instance, silicon).

The wafer 200 and the wafer 100 are coupled together, for example via bonding of a glass-fit type, or by metal bonding, thermal-compression bonding, eutectic bonding, anodic bonding, bonding by adhesives or glues, or other types of bonding. The bonding layer is represented schematically in FIG. 7 and designated by the reference number 118. The recess 116 thus forms the cavity 52, over which the mobile body 54 is suspended, as discussed with reference to FIG. 2.

The fluidic paths 122 formed in the step of FIG. 6 have the function of setting the recess 116/cavity 52 in fluid connection with the external environment, and therefore extend between the recess 116 and the edge regions of the wafer 100 or 200. In this way, possible variations of the internal pressure of the cavity 52 during the manufacturing steps do not cause physical damage to the wafer 100 and/or 200 in so far as the passage of the air through these fluidic paths 122 (as represented by the arrows 124 in FIG. 7) provides a pressure balance.

Figure 8:
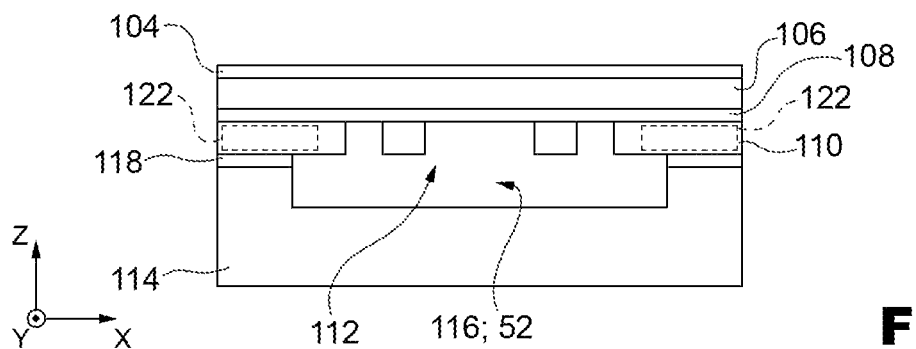

Next, as shown in FIG. 8, a step of thinning the wafer 100 at the substrate 102 is carried out in order to reduce the thickness thereof. In particular, the substrate 102 is completely removed, leaving the insulating layer 104 exposed. Removal of the substrate 102 is performed, for example, by an etching step (the insulating layer 104 has, in this context, the function of etch-stop layer), or by chemical-mechanical polishing (CMP), or with some other technique suited for the purpose. At the end of removal of the substrate 102, the insulating layer 104, or part thereof, remains on the wafer. In the case where the processing step here considered were to cause removal of the insulating layer 104, a step of formation of a further insulating layer, similar to the insulating layer 104, on the structural layer 106 is carried out.

Figure 9:
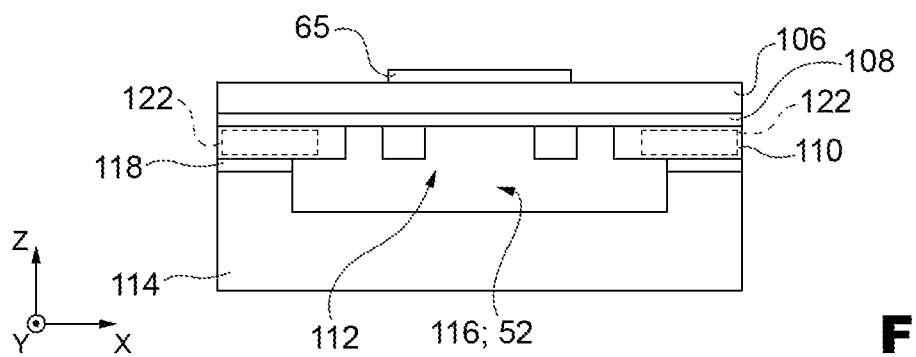

Then, as shown in FIG. 9, steps are carried out including formation of the actuators 70-76 by depositing in succession on the insulating layer 104 exposed in the step of FIG. 8, a first electrode layer, a piezoelectric layer, and a second electrode layer, so that the piezoelectric layer is sandwiched between the two electrode layers. By lithographic and etching steps, the desired shape of the actuators 70-76 is then defined (for example, as illustrated in FIG. 2). Moreover, electrical contacts (e.g., paths of conductive material, such as metal) are formed in order to enable biasing, in use, of the electrodes of the actuators 70-76.

During the step of FIG. 9, the insulating layer 104 is partially removed and/or patterned, so that the insulating layer 104 remains underneath the actuators 70-76 (in order to insulate them electrically at the bottom) and underneath the conductive paths for biasing the actuators. The insulating layer 104 is instead removed where, as illustrated in FIG. 10, it is desired to pattern the structural layer 106 in order to complete formation of the MEMS device 30 (in particular, for the photolithographic definition and etching steps for providing structural parts of the oscillating structure).

A step of deposition of reflective material (e.g., aluminium or gold), and subsequent lithographic and etching steps, are then also carried out to form the mirror layer 65. The steps of formation of the pads 81 and/or conductive paths 83 for biasing the actuators and the mirror layer 65 may, at least in part, be simultaneous. In this case, the conductive pads 81/paths 83 may be of the same material as the one chosen for the mirror layer 65. It may be noted that the mirror layer 65 may be formed indifferently over the structural layer 106 or over the insulating layer 104. The conductive paths 83 are, instead, preferably formed on the insulating layer 104 in order to provide electrical insulation during use.

Figure 10:
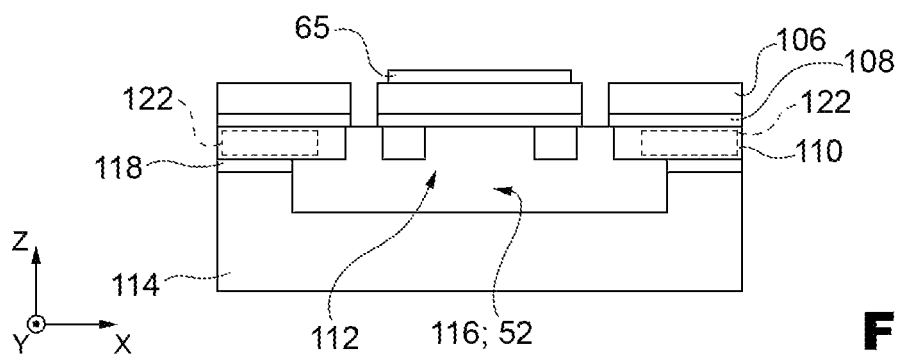

With reference to FIG. 10, the structural layer 106 is etched so as to remove selective portions of the structural layer 106 to define the desired shape of the mobile body 54, of the first and second deformable elements 56, 58, and of the portions that house (support) the actuators 70-76, as illustrated in FIG. 2. Etching of the structural layer 106 proceeds until the insulating layer 108 is reached and continues through the insulating layer 108, thus releasing the MEMS structure, which can move according to its own degrees of freedom. The cap 114 is not etched or removed and functions as structural support for the rest of the MEMS device. The recess 116 has a depth and dimensions such as not to interfere mechanically with the oscillation of the mobile body 54, which extends over the recess 116/cavity 52.

In one embodiment, the MEMS device 30 further comprises an electronic control circuit (not illustrated), adapted to start, and then maintain, the oscillation of the mobile body 54. The electronic control circuit may be integrated in the same die that houses the MEMS device 30, or else set outside the die that houses the MEMS device 30, according to the design requirements and specifications.

The electronic control circuit is configured to generate the driving voltages for the actuators 70-76, for example in the form of voltage/current pulses. According to one embodiment, the mobile body 54 is made to oscillate at its resonance frequency.

The electronic control circuit may moreover manage start-up of the oscillation of the mobile body 54, starting from a state in which the latter is stationary in a resting condition.

The advantages that derive from the present disclosure are evident from what has been set forth above.

In particular, the manufacturing method proposed envisages initial steps of patterning of the silicon wafer for formation of the structures that, in use, correspond to the back of the micro-mirror (in particular, the annular structure) and, subsequently, steps of machining of the front of the micro-mirror, of formation of the actuators and of the reflecting layer, and of photolithographic definition of the various structural components. In this way, the elements of the micro-mirror that extend at the front are not damaged during the steps of processing of the back, with evident advantages.

Finally, it is clear that modifications and variations may be made to what has been described and illustrated herein, without thereby departing from the scope of the present disclosure, as defined in the annexed claims.

For instance, in FIG. 1 the MEMS device has been described, purely by way of example, with reference to reflection of an optical beam, and therefore including at least one mirror. Other uses of the MEMS device are, however, possible. In general, the MEMS device may be applied to a different oscillating system, for example to MEMS resonators for generation of clock signals.

Furthermore, the mobile body 54 may have a circular or oval shape or follow some other curvilinear path, or even a square path.

In addition, according to a further embodiment, a number of actuators different from four may be present, for example just two actuators.

It is moreover possible for the projective MEMS system 20 of FIG. 1 to include, in addition to the MEMS device, according to any embodiment of the present disclosure, also an additional MEMS device, interposed between the MEMS device 30 and the screen 32 and adapted to receive the reflected optical beam OB2, to generate a further reflected optical beam and to send the further reflected optical beam onto the screen 32. In this way, it is possible to scan the screen 32 with the further reflected optical beam, along a first direction and a second direction, for example orthogonal to one another.

It is likewise possible for the MEMS device 30 to include moreover a movement device, for example of an electromagnetic type, adapted to rotate the central portion 60, and therefore the mirror layer 65, about a further axis parallel, for example, to the axis Y.

The invention claimed is:

1. A method of processing a wafer having a first side and a second side opposite to one another to manufacture an oscillating structure, comprising:
   a) forming first and second elastic torsional elements which are constrained to respective portions of a fixed supporting body and define an axis of rotation;
   b) forming a mobile element interposed between, and connected to, said first and second elastic torsional elements, the mobile element being rotatable about the axis of rotation as a consequence of a torsion of the first and second elastic torsional elements;
c) processing the first side of said wafer at the mobile element to form a mechanical reinforcement structure for the mobile element, by:
c1) growing a reinforcement layer on the first side of the wafer; and
c2) patterning said reinforcement layer by removing selective portions of the reinforcement layer; and
d) processing the second side of said wafer, including carrying out, at the second side of the wafer, at least one of: chemical etching, deposition of metal material, and deposition of piezoelectric material;
wherein step d) is performed after performing step c).

2. The method according to claim 1, further comprising coupling a supporting structure to the first side of the wafer, after performing step c) but before performing step d).

3. The method according to claim 2, further comprising providing the supporting structure with a recess, and wherein coupling the supporting structure to the first side of the wafer is carried out so that the mechanical reinforcement structure is completely contained within said recess.

4. The method according to claim 3, further comprising removing selective portions of the reinforcement layer to form at least one fluidic access channel adapted to set in fluidic communication the recess with an environment external to the recess.

5. The method according to claim 1, wherein step d) includes processing the second side of said wafer, including carrying out, at the second side of the wafer, at least deposition of metal material; wherein the deposition of metal material is carried out to form a reflecting layer on the mobile element and/or an electrical contact and/or an electrical path; and wherein the deposition of piezoelectric material is carried out to form a piezoelectric actuator configured to cause, in use, said torsion of the first and the second elastic torsional elements.

6. The method according to claim 1, wherein said wafer is a silicon on insulator (SOI) wafer including an insulating layer interposed between a substrate and a structural layer; wherein the method further comprises forming an etch-stop layer on the structural layer, said reinforcement layer being grown on the etch-stop layer and wherein forming the mechanical reinforcement structure includes masked etching of the reinforcement layer for removing selective portions thereof until the etch-stop layer is reached.

7. The method according to claim 1, wherein said wafer is a SOI wafer including an insulating layer interposed between a substrate and a structural layer; and wherein processing the second side of the wafer comprises:
carrying out a thinning the substrate until the insulating layer is reached;
removing selective portions of the insulating layer to expose respective surface regions of the structural layer; and
carrying out at least one operation from among said chemical etching, said deposition of metal material, and said deposition of piezoelectric material.

8. The method according to claim 1, wherein said chemical etching is carried out to form a central body of the oscillating structure, the first elastic torsional element, the second elastic torsional element, and the mobile element.

9. The method according to claim 1, wherein said chemical etching is carried out to form one or more structures configured to carry out electrostatic actuation of said oscillating structure.

10. A method of processing a wafer having a first side and a second side opposite to one another to manufacture an oscillating structure, comprising:
a) forming first and second elastic torsional elements which are constrained to respective portions of a fixed supporting body and define an axis of rotation;
b) forming a mobile element interposed between, and connected to, said first and second elastic torsional element;
c) processing the first side of said wafer at the mobile element to form a mechanical reinforcement structure for the mobile element, by:
c1) growing a reinforcement layer on the first side of the wafer; and
c2) patterning said reinforcement layer by removing selective portions of the reinforcement layer to produce an annular reinforcement structure supporting the mobile element about a periphery thereof; and
d) processing the second side of said wafer, including carrying out, at the second side of the wafer, at least one of: chemical etching, deposition of metal material, and deposition of piezoelectric material.

11. The method according to claim 10, further comprising coupling a supporting structure to the first side of the wafer, after performing step c) but before performing step d).

12. The method according to claim 11, further comprising providing the supporting structure with a recess, and wherein coupling the supporting structure to the first side of the wafer is carried out so that the mechanical reinforcement structure is completely contained within said recess.

13. The method according to claim 10, wherein step d) includes processing the second side of said wafer, including carrying out, at the second side of the wafer, at least deposition of metal material; wherein the deposition of metal material is carried out to form a reflecting layer on the mobile element and/or an electrical contact and/or an electrical path; and wherein the deposition of piezoelectric material is carried out to form a piezoelectric actuator.

14. The method according to claim 11, wherein said wafer is a silicon on insulator (SOI) wafer including an insulating layer interposed between a substrate and a structural layer; wherein the method further comprises forming an etch-stop layer on the structural layer, said reinforcement layer being grown on the etch-stop layer and wherein forming the mechanical reinforcement structure includes masked etching of the reinforcement layer for removing selective portions thereof until the etch-stop layer is reached.

15. The method according to claim 11, wherein said wafer is a SOI wafer including an insulating layer interposed between a substrate and a structural layer; and wherein processing the second side of the wafer comprises:
thinning the substrate until the insulating layer is reached;
removing selective portions of the insulating layer to expose respective surface regions of the structural layer; and
carrying out at least one operation from among said chemical etching, said deposition of metal material, and said deposition of piezoelectric material.

16. The method according to claim 11, wherein said chemical etching is carried out to form a central body of the oscillating structure, the first elastic torsional element, the second elastic torsional element, and the mobile element.

17. The method according to claim 11, wherein said chemical etching is carried out to form one or more structures configured to carry out electrostatic actuation of said oscillating structure.

18. A method of processing a wafer having a first side and a second side opposite to one another to manufacture an oscillating structure, wherein said wafer is a silicon on insulator (SOI) wafer including an insulating layer interposed between a substrate and a structural layer, comprising:
   a) forming first and second elastic torsional elements which are constrained to respective portions of a fixed supporting body and define an axis of rotation;
   b) forming a mobile element interposed between, and connected to, said first and second elastic torsional elements, the mobile element being rotatable about the axis of rotation as a consequence of a torsion of the first and second elastic torsional elements;
   c) processing the first side of said wafer at the mobile element to form a mechanical reinforcement structure for the mobile element, by:
      forming an etch-stop layer on the structural layer,
      growing a reinforcement layer on the etch-stop layer, and
      masked etching of the reinforcement layer for removing selective portions thereof until the etch-stop layer is reached; and
   d) processing the second side of said wafer, including carrying out, at the second side of the wafer, at least one of: chemical etching, deposition of metal material, and deposition of piezoelectric material;
   wherein step d) is performed after performing step c).

19. The method according to claim 18, further comprising coupling a supporting structure to the first side of the wafer, after performing step c) but before performing step d).

20. The method according to claim 19, further comprising providing the supporting structure with a recess, and wherein coupling the supporting structure to the first side of the wafer is carried out so that the mechanical reinforcement structure is completely contained within said recess.

21. The method according to claim 20, where removing selective portions of the reinforcement layer forms at least one fluidic access channel adapted to set in fluidic communication the recess with an environment external to the recess.

22. The method according to claim 18, wherein step d) includes processing the second side of said wafer, including carrying out, at the second side of the wafer, at least deposition of metal material; wherein the deposition of metal material is carried out to form a reflecting layer on the mobile element and/or an electrical contact and/or an electrical path; and wherein the deposition of piezoelectric material is carried out to form a piezoelectric actuator configured to cause, in use, said torsion of the first and the second elastic torsional elements.

23. The method according to claim 18, wherein processing the second side of the wafer comprises:
   carrying out a thinning the substrate until the insulating layer is reached;
   removing selective portions of the insulating layer to expose respective surface regions of the structural layer; and
   carrying out at least one operation from among said chemical etching, said deposition of metal material, and said deposition of piezoelectric material.

24. The method according to claim 18, wherein said chemical etching is carried out to form a central body of the oscillating structure, the first elastic torsional element, the second elastic torsional element, and the mobile element.

25. The method according to claim 18, wherein said chemical etching is carried out to form one or more structures configured to carry out electrostatic actuation of said oscillating structure.

* * * * *